United States Patent [19]

Ackerman et al.

[11] Patent Number: 5,001,720
[45] Date of Patent: Mar. 19, 1991

[54] HYBRID NARROW LINEWIDTH SEMICONDUCTOR LASER WITH UNIFORM FM RESPONSE

[75] Inventors: David A. Ackerman, Hopewell, N.J.; Chien Y. Kuo, Wescosville, Pa.

[73] Assignee: AT&T Bell Laboratories, Murray Hill, N.J.

[21] Appl. No.: 456,991

[22] Filed: Dec. 26, 1989

[51] Int. Cl.$^5$ ................................................ H01S 3/19
[52] U.S. Cl. ........................................ 372/50; 372/26; 372/29; 372/45
[58] Field of Search .................... 372/50, 45, 43, 44, 372/26, 28, 29, 32

[56] References Cited

U.S. PATENT DOCUMENTS

| | | | |
|---|---|---|---|
| 4,101,845 | 7/1978 | Russer | 372/26 |
| 4,564,946 | 1/1986 | Olsson et al. | 372/50 |
| 4,720,835 | 1/1988 | Akiba et al. | 372/50 |
| 4,730,327 | 3/1988 | Gordon | 372/45 |
| 4,748,630 | 5/1988 | Nagashima | 372/50 |
| 4,773,076 | 9/1988 | Yamamoto et al. | 372/50 |

OTHER PUBLICATIONS

"On the Linewidth Enhancement Factor . . . ", K. Vahala et al., *Appl. Phys. Lett.*, vol. 42, No. 8, Apr. 1983, pp. 631–633.
"Small-Signal Response of a Semiconductor Laser . . . ", O. Nilsson et al., *Appl. Phys. Lett.*, vol. 46, No. 3, Feb. 1985, pp. 233–235.
"Realization of Flat FM Response . . . ", S. Yamazaki et al., *Elec. Lett.*, vol. 21, No. 7, Mar. 1985, pp. 283–285.
"Multielectrode Distributed Feedback Laser . . . ", Y. Yoshikuni et al., *Journal Lightwave Tech.*, vol. LT-5, No. 4, Apr. 1987, pp. 516–522.
"Formulas for Direct Frequency Modulation . . . ", O. Nilsson et al., *Elec. Lett.*, vol. 23, No. 25, Dec. 1987, pp. 1371–1372.
"Compact Silicon-Chip Bugg Reflector . . . ", D. A. Ackerman et al., *IEEE Eleventh Int. Conf. on Semic. Lasers*, Aug. 1988, pp. 200–201.

*Primary Examiner*—Georgia Epps
*Attorney, Agent, or Firm*—W. W. Koba

[57] ABSTRACT

A hybrid laser arrangement is disclosed which is capable of providing an essentially uniform FM response and a relatively narrow linewidth signal, suitable for FM applications. The uniform FM response is obtained by inducing inhomogeneous linewidth enhancement through control of the bias currents applied to separate gain sections of a two-electrode Fabry-Perot device. Coupling of the two-electrode device to a narrowband resonant optical reflector provides for an extremely narrow signal linewidth.

11 Claims, 3 Drawing Sheets

HYBRID NARROW LINEWIDTH SEMICONDUCTOR LASER WITH UNIFORM FM RESPONSE

BACKGROUND OF THE INVENTION

1. Field of the Invention

The present invention relates to a semiconductor laser for FM applications and, more particularly, to a hybrid semiconductor laser arrangement with both a narrow linewidth and relatively uniform FM response suitable for coherent communication and sensing applications.

2. Description of the Prior Art

Advances in the field of optical communication and sensing systems are currently directed towards a coherent system utilizing a frequency modulated laser transmitter, single mode optical fiber, and an optical heterodyne (or homodyne) receiver. Two of the most important requirements in such a coherent system are narrow laser linewidth (required for low noise mixing at the receiver) and uniform FM response (i.e., minimal changes in phase) over as broad a frequency range as possible. Narrow linewidth has been achieved with an arrangement including a conventional semiconductor laser coupled to a glass-on-silicon distributed Bragg reflector. In particular, the Bragg reflector consists of a $SiO_2$ clad $Si_3N_4$ core, ridge waveguide of length approximately 3 mm, with a first-order diffraction grating imposed on the top-most cladding surface. With this geometry, the Bragg reflector will exhibit a reflection band approximately 6 Å wide. The laser and reflector are butt coupled, with alignment of the laser cavity to the waveguide. The resultant linewidth measurement for the hybrid device yields a linewidth ($\Delta v$) of less than 200 kHz, with a minimum of 110 kHz. A complete description of this device may be found in the article entitled "Compact Silicon-Chip Bragg Reflector Hybrid Laser with 110 kHz Linewidth", by D. A. Ackerman et al., appearing in *IEEE Eleventh International Conference on Semiconductor Lasers Proceedings*, Aug. 1988, at pp. 200–201.

Although the above-referenced arrangement is acceptable for certain applications, the uniformity of the FM response is also a concern, which the Ackerman et al. hybrid device does not address. In particular, there are many situations where the appearance of a phase reversal in the FM response will seriously degrade the performance of the system. For example, in an optical phase locked loop, a phase reversal in the FM response will create an unwanted error signal and thus disrupt system performance. Broadband (i.e., a few hundred MHz) and uniform FM response has been obtained utilizing, for example, a multi-electrode laser structure. The possibility of creating one such structure is discussed in the article "Small-signal response of a semiconductor laser with inhomogeneous linewidth enhancement factor: Possibilities of a flat carrier-induced FM response", by O. Nilsson et al. appearing in *Applied Physics Letters*, Vol. 46, No. 3, Feb. 1985, at pp. 223–5. In this article, the authors develop a series of relations which show that by introducing inhomogeneities in the linewidth enhancement factor $\alpha$ by creating a device including two regions with different values of the $\alpha$ parameter (and hence different gain values) a relatively flat FM response with no phase reversal may be obtained. However, this work does not address the issue of providing a relatively narrow linewidth.

What is lacking in the prior art, therefore, is a device which simultaneously exhibits a relatively narrow linewidth (e.g., on the order of kHz) and an essentially uniform FM response over a relatively broad range.

SUMMARY OF THE INVENTION

The need remaining in the prior art is addressed by the present invention which relates to a semiconductor laser for FM applications and, more particularly, to a hybrid semiconductor laser arrangement with both a relatively narrow linewidth and an essentially uniform FM response.

In accordance with one embodiment of the present invention, a hybrid laser comprises a Fabry-Perot device with two separate gain sections coupled to a narrowband resonant optical reflector. The two gain sections of the Fabry-Perot device are biased such that the injection current of one gain section (usually the section coupled to the reflector) is maintained less than the injection current of the other section (which must be biased at least at threshold), so as to create an inhomogeneous linewidth enhancement ($\alpha$) between the two gain sections. The uniform FM response is attributed to this inhomogeneous linewidth enhancement created by the non-uniform current injection. The light exiting one facet of the Fabry-Perot device is coupled into the waveguide section of the narrowband resonant optical reflector (ROR) wherein the signal passing into the reflector and re-entering the Fabry-Perot device will have a relatively narrow linewidth. The output from the hybrid arrangement is thus the signal exiting the opposite facet (with respect to the ROR) of the Fabry-Perot device.

It is an advantage of the present invention that FM communication may be achieved by impressing a modulating current, $I_{mod}$, related to a particular message signal, over the bias current of one of the gain sections. In a preferred embodiment, the modulating current $I_{mod}$ is impressed over the lower-valued injection current (usually $I_b$).

Other and further advantages of the present invention will become apparent during the course of the following discussion and by reference to the accompanying drawings.

BRIEF DESCRIPTION OF THE DRAWING

Referring now to the drawings.

DETAILED DESCRIPTION

Figure 1:
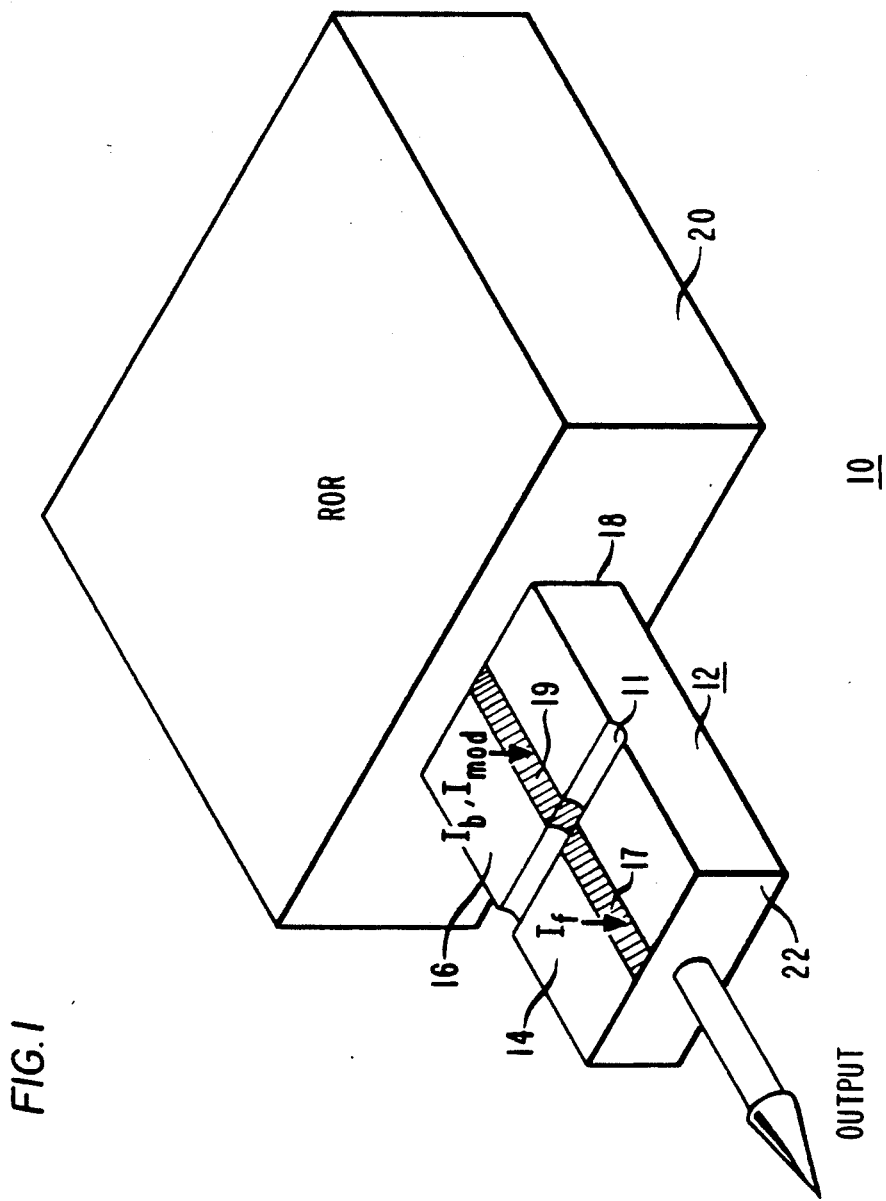
FIG. 1 illustrates an exemplary hybrid laser arrangement of the present invention.

FIG. 1 illustrates an exemplary hybrid laser arrangement 10 of the present invention. As shown, hybrid laser 10 comprises a two-electrode Fabry-Perot device 12 including a first gain section 14 and a second gain section 16, with a predetermined amount of electrical isolation R therebetween (typically, greater that 200 Ω). In one exemplary embodiment, device 12 may comprise an InP/InGaAsP buried double heterostructure laser with a stripe geometry (not shown) capable of confining a current to flow in a relatively narrow region. The strip geometry is considered well-known in the art and will not be reviewed here. As illustrated in FIG. 1, isolation R may be achieved by forming a groove 11 between gain sections 14 and 16. Isolation may also be achieved by forming an insulating region (e.g., a layer of SiO$_2$) or current blocking region (e.g., a section of Fe-doped InP) between gain sections 14 and 16. These and other various means of forming isolation are considered to fall within the scope of the present invention and are suitable for the purpose of providing electrical isolation between sections of a Fabry-Perot device.

During the course of the following discussion first section 14 of device 12 may also be referred to as the "front section" and second section 16 as the "back section", where these terms are considered to be interchangeable. A separate bias current, $I_f$ and $I_b$, is applied via electrodes 17 and 19 to front section 14 and back section 16, respectively. Back section 16, as seen in FIG. 1, is optically coupled along facet 18 to a narrowband resonant optical reflector (ROR) 20, where in a preferred embodiment facet 18 is AR-coated to prevent multiple transists of the signal within laser 12 and ROR 20. In the operation of hybrid arrangement 10, a modulating current signal $I_{mod}$ is impressed over either $I_f$ or $I_b$. In most cases, $I_{mod}$ will be impressed on back section bias current $I_b$. As shown in FIG. 1, the output from arrangement 10 exits facet 22 of first section 14.

In accordance with the teachings of the present invention, uniform FM response is achieved when the injection currents $I_b$ and $I_f$ are unequal. As discussed above, the inequality in currents results in an inhomogeneous linewidth enhancement factor ($\alpha$). As will be described in detail below, the inhomogeneity will provide a relatively uniform FM response. In particular, the injection current to back section 16, $I_b$, may be maintained less than the injection current $I_f$ applied to front section 14. Alternatively, injection current $I_f$ may be maintained less than $I_b$. However, since the output power is directly proportional to injection current, the gain section from which the output signal will exit (e.g., front section 14 of FIG. 1) should preferably having the higher injection current value. For the purposes of the present discussion, it will be assumed that $I_f > I_b$. However, it is be to understood that the opposite condition (i.e., $I_f < I_b$) may be utilized within the scope of the present invention.

The dependence of the FM response on the injection current is the result of two separate physical processes. The first is charge-carrier-induced FM related to the longitudinally inhomogeneous linewidth enhancement factor ($\alpha$) through the waveguide of each gain section 14, 16, created by maintaining $I_b < I_f$ (or, alternatively, $I_f < I_b$). The second process is the relatively invariant thermally-induced FM related to the laser being temperature modulated during current modulation. In particular, the FM response of a non-uniformly biased two-section Fabry-Perot device can be written as:

$$\Delta\omega = \Delta\omega_c + \Delta\omega_t, \quad (1)$$

where $\Delta\omega_c$ is defined as the carrier-induced FM response and $\Delta\omega_t$ is defined as the thermally-induced FM response. Although the thermal FM portion of the response cannot be specified by a single parameter, the term may be expressed as $$\Delta\omega_t = -\frac{K}{1 + \frac{j\Omega}{\Omega_t}}, \quad (2)$$

where K is a constant relating the frequency shift to the thermal load in the laser junction, $\Omega$ is the modulating frequency, and $\Omega_t$ is defined as the characteristic frequency (a value of approximately 1 MHz). The carrier-induced term $\Delta\omega_c$ has been previously defined in the literature (see O. Nilsson et al., supra, at p. 223) that this term may be expressed as follows:

$$\Delta\omega_c = \frac{\Delta n}{2n} \frac{A_f B_f \tau_f (\alpha_b - \alpha_f)}{2n(1 + B_f \tau_f + j\Omega\tau_f)} + \frac{\Delta n}{2n}(-\epsilon_b + j\Omega)\alpha_b, \quad (3)$$

where n is the total number of photons in the laser, $\Delta n$ is the change in the number of photons with intensity modulation, $A_{f(b)}$ is the rate of stimulated emission/photon for the front(back) section, $B_f$ is the differential rate of stimulated emission with respect to the carrier number, $\alpha_{f(b)}$ is the linewidth enhancement factor of the front(back) section, $\tau_f$ is the carrier spontaneous lifetime in the front section and, lastly, $\Omega$ is the modulating frequency. The gain saturation factor, defined as $\epsilon = n\partial A/\partial n$, is usually a negative value.

The first term of equation (3) is related to the effect of having a difference in the linewidth enhancement factor ($\alpha$) as a result in maintaining different bias currents ($I_{b,f}$). If this term is negative (i.e., $\alpha_f > \alpha_b$), the laser will exhibit a red-shifted FM response induced by carrier modulation. The denominator in the first term gives rise to a rolloff in the FM response at a frequency of $(1 + B_f \tau_f)/\tau_f$, which is typically a few hundred MHz. The second term in equation (3) increases in magnitude with increasing frequency, but remains small in comparison to the first term. At low frequencies, therefore, $\Delta\omega_c$ is in phase with $\Delta\omega_t$ and the overall FM response is merely the algebraic sum of equations (2) and (3). Further, if the magnitude of $\Delta\omega_c$ is greater than the magnitude of $\Delta\omega_t$, the overall FM response will be dominated by $\Delta\omega_c$.

As the difference between the linewidth enhancement factors decreases (i.e., $I_b$ approaches $I_f$), the effect of $\Delta\omega_c$ decreases, leaving the second term in equation (3) to dominate. In particular, if $I_b = I_f$, the first term in equation (3) will disappear. Further, if $I_b$ becomes greater than $I_f$, the first term in equation (3) will be positive, indicating an FM response which is antiphased with respect to the thermal FM. In this case, the magnitude of the vector sum of $\Delta\omega_c$ and $\Delta\omega_t$ will reach a minimum magnitude (indicating an FM dip and phase reversal), at a predetermined frequency related to the values and phases of the various terms in equations (2) and (3). As discussed above, the appearance of a phase reversal in the FM response is unacceptable in many lightwave sensing systems. For example, in optical phase-locked loop applications, large changes in phase cannot be compensated. Therefore, in accordance with the teachings of the present invention, the bias current $I_b$ applied to back section 16 of hybrid 10 must be maintained at a different value than the bias current $I_f$ applied to front section 14. In most cases, $I_b$ will be less than $I_f$ when maximum output power from front section 14 is desired.

Linewidth narrowing in hybrid laser 10 is achieved by coupling back section 16 of Fabry-Perot device 12 to a narrowband resonant optical reflector 20. A detailed description of an exemplary resonant optical reflector may be found in the article entitled "A Narrow-Band $Si_3N_4$-$SiO_2$ Resonant Optical Reflector", by C. H. Henry et al., appearing in the *IEEE Journal of Quantum Electronics*, Vol. QE-23, No. 9, Sept. 1987, at pp. 1426–8, which is herein incorporated by reference. Generally, narrowband optical reflector 20 can be defined as an external cavity consisting of an input waveguide disposed next to a high Q resonator in a side-by-side relationship, the resonator comprising a pair of Bragg reflectors which are shifted a quarter wavelength with respect to each other. Fabry-Perot device 12 is coupled to ROR 20 at backface 18 such that a resonant reflection results. Operating in a regime where the Q is determined by grating scattering within the resonator, the reflection bandwidth of a typical resonator is known to be less than 0.5 Å. The combination of ROR 20 with Fabry-Perot device 12 has been found to yield a linewidth narrowing of $dg_{th}/d\lambda$ of approximately 20 $cm^{-1}/Å$. A resulting laser linewidth reduction factor of approximately 1000 may thus be achieved, yielding a linewidth of less than 10 kHz. Therefore, by coupling the radiation exiting backface 18 of Fabry-Perot device 12 into narrowband optical reflector 20, a resonant reflection, with an extremely narrow bandwidth is directed back into Fabry-Perot device 12. The resulting narrow linewidth emission exits from front facet 22 as indicated in FIG. 1.

Figure 2:
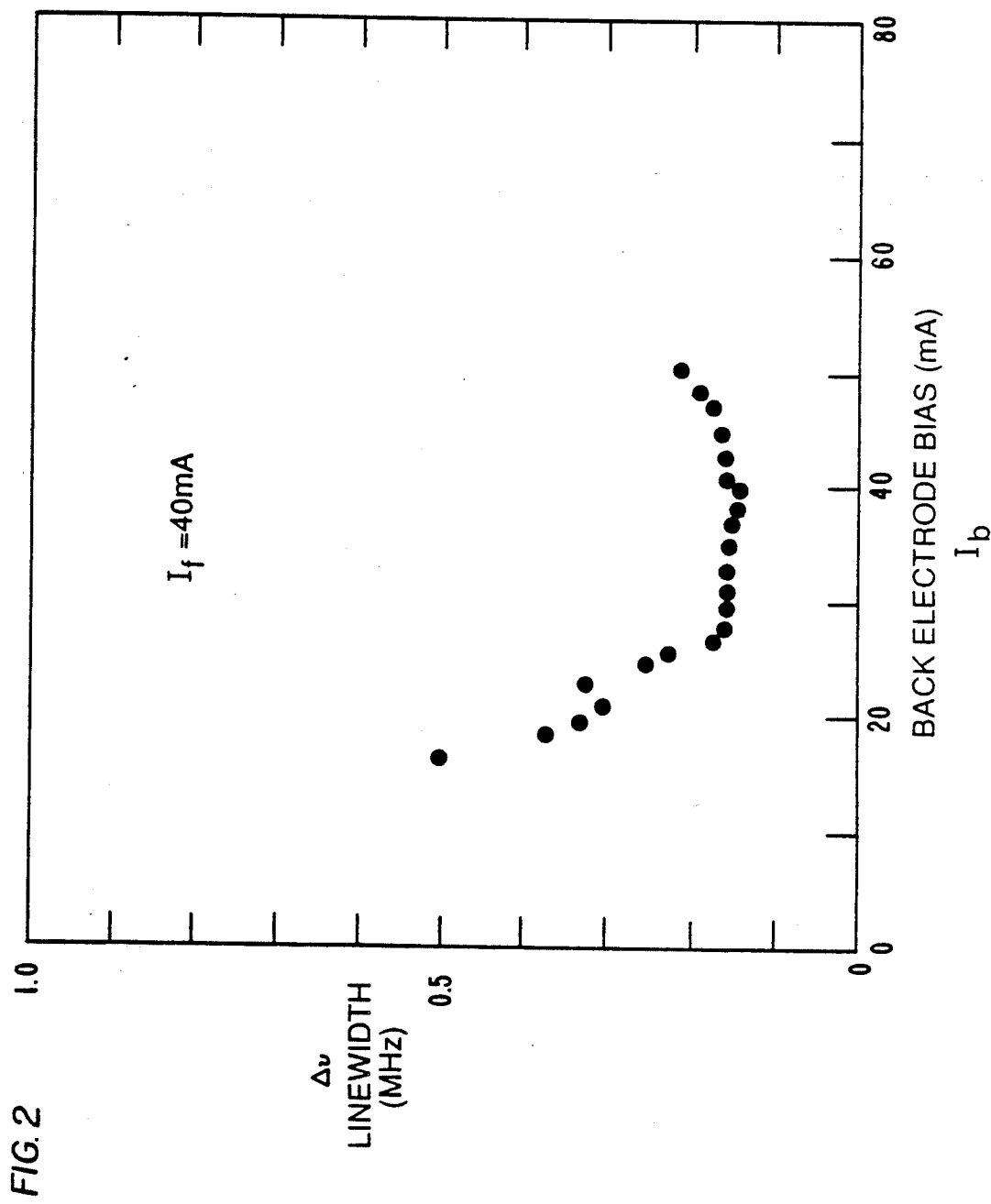
FIG. 2 contains a graph of laser linewidth ($\Delta v$) as a function of the bias current applied to the modulating section of the Fabry-Perot device.

FIG. 2 contains a graph illustrating the relationship between the output linewidth $\Delta v$ and bias current $I_b$ applied to the modulated section 16 of Fabry-Perot device 12, with a bias current $I_f$ on front section 14 fixed at a value of approximately 40 mA. As shown, for increasing values of bias current $I_b$, the linewidth $\Delta v$ drops from a value of approximately 0.5 MHz at $I_b=15$ mA to a minimum of approximately 100 kHz at $I_b=40$ mA. This decrease in linewidth $\Delta v$ may be attributed to the rate of decrease in the threshold gain as a function of wavelength. The slight rise in linewidth at higher bias current levels can be explained by impending mode hop of the laser output as a function of increased biased current.

Figure 3:
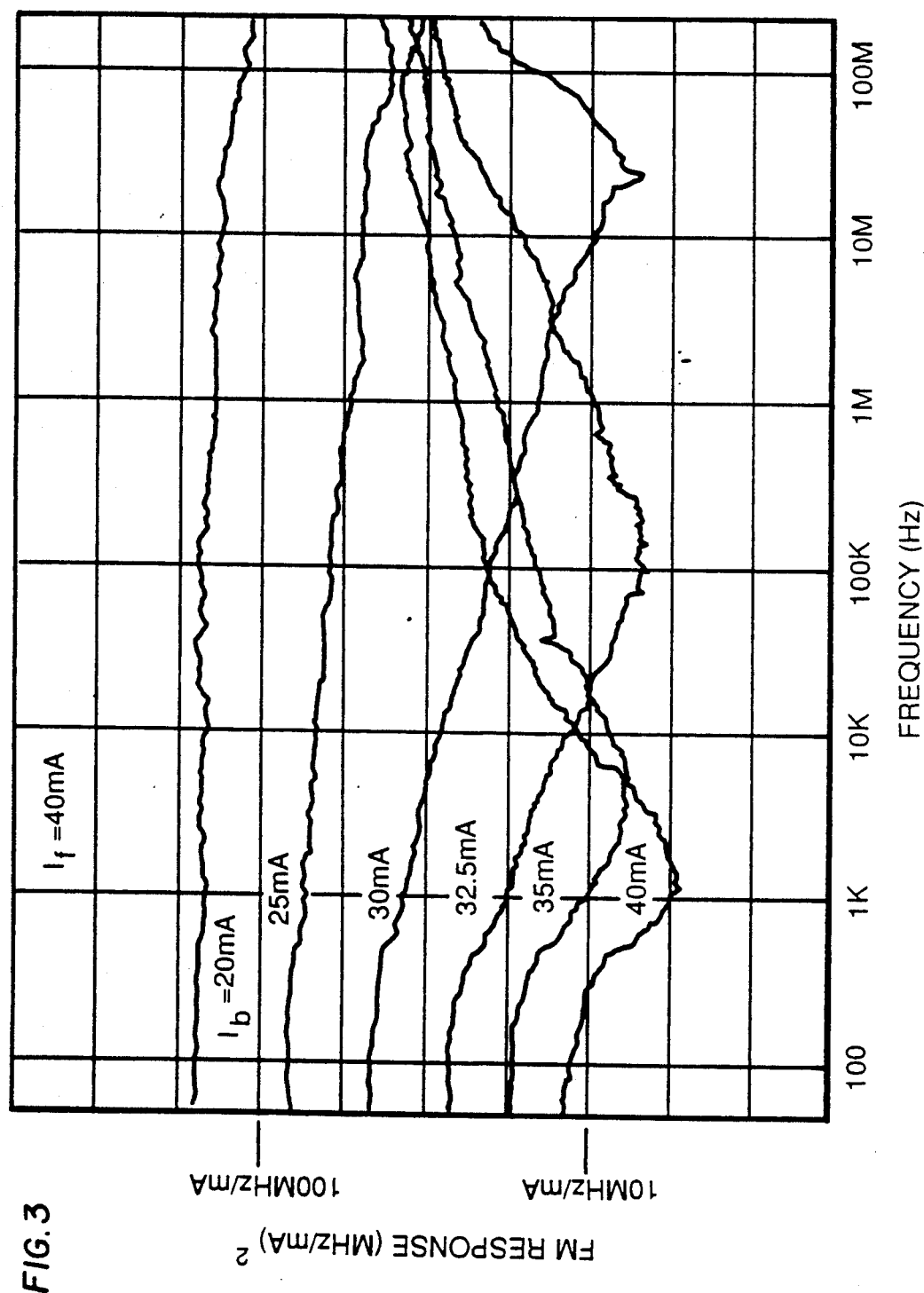
FIG. 3 is a graph illustrating the FM response of the hybrid laser arrangement of the present invention as a function of the bias current applied to the modulated section.

FIG. 3 shows the measured FM response of hybrid arrangement 10, as a function of bias current $I_b$. Since an unbalanced current injection ($I_b < I_f$) between the two sections creates inhomogeneous linewidth enhancement, the FM response exhibits changes in both sensitivity and bandshape as a function of bias current. For example, at $I_b=20$ mA, the FM response is uniform from DC to at least 200 MHz. No phase change is observed throughout the entire frequency range, implying that the overall FM response is red-shifted to at least 200 MHz. At $I_b=25$ mA, the FM sensitivity is reduced at DC by approximately 5 dB, accompanied by a gradual decrease with frequency of at least an additional 5 dB by 10 MHz. The FM response remains red-shifted at this bias current level. However, the FM characteristics change drastically when $I_b$ is increased beyond 30 mA. As shown, at $I_b=30$ mA, an FM dip develops at approximately 20 MHz, indicating a phase reversal at this frequency. This response indicates that the FM is redshifted at frequencies below 20 MHz and blue-shifted above 20 MHz. As $I_b$ increases further, the FM dip moves to lower frequencies, accompanied by an increase of the blue-shifted FM and further drops in sensitivity.

We claim:
1. A hybrid laser for FM applications comprising
   a Fabry-Perot device including a first gain section and a second gain section with electrical isolation therebetween, the first section capable of being biased at a first predetermined current level $I_f$ and the second section capable of being biased at a second predetermined current level $I_b$ such that $I_f$ is not equal to $I_b$; and
   a narrowband resonant optical reflector coupled to the second gain section.
2. A hybrid laser as defined in claim 1 wherein $I_f$ is greater than $I_b$.
3. A hybrid laser as defined in claim 1 wherein $I_b$ is greater than $I_f$.
4. A hybrid laser as defined in claim 1 wherein the second gain section includes an anti-reflection coating disposed between the second gain section and the narrowband resonant optical reflector so as to suppress facet reflections of signals exiting said Fabry-Perot device and said narrowband resonant optical reflector.
5. A hybrid laser as defined in claim 1 wherein the electrical isolation comprises a groove formed in the Fabry-Perot device between the first and second gain sections.
6. A hybrid laser as defined in claim 1 wherein the electrical isolation comprises a dielectric material disposed between the first and second gain sections.
7. A hybrid laser as defined in claim 6 wherein the dielectric material comprises $SiO_2$.
8. A hybrid laser as defined in claim 1 wherein the electrical isolation comprises a current-blocking layer disposed between the first and second gain sections.
9. A hybrid laser as defined in claim 8 wherein the current blocking layer comprises Fe-doped InP.
10. A hybrid laser as defined in claim 1 wherein the Fabry-Perot device comprises an InP/InGaAsP double heterostructure laser.
11. A hybrid laser arrangement for FM applications comprising
   an InP/InGaAsP double heterostructure laser including a first gain section and a second gain section, with electrical isolation therebetween, the first gain section for being biased at a predetermined current $I_f$ and the second for being biased at a predetermined current $I_b$, wherein $I_f > I_b$, with a modulating current $I_{mod}$, defines as a message signal, for being impressed upon the predetermined current $I_b$; and a narrowband resonant optical reflector coupled to the second gain section of the double heterostructure laser, with the second gain section including an anti-reflection coating so as to suppress facet reflections at said laser and said narrowband resonant optical reflector.

* * * * *